(12) United States Patent
Marchetti et al.

(10) Patent No.: US 11,467,209 B2
(45) Date of Patent: Oct. 11, 2022

(54) SIGNAL INJECTION TECHNIQUE FOR MEASUREMENT AND CONTROL OF SOURCE REFLECTION COEFFICIENT OF A DEVICE UNDER TEST

(71) Applicant: Anteverta-mw B.V., Eindhoven (NL)

(72) Inventors: Mauro Marchetti, Eindhoven (NL); Michele Squillante, Eindhoven (NL)

(73) Assignee: Anteverta-mw B.V., Eindhoven (NL)

( * ) Notice: Subject to any disclaimer, the term of this patent is extended or adjusted under 35 U.S.C. 154(b) by 36 days.

(21) Appl. No.: 16/975,426

(22) PCT Filed: Mar. 1, 2019

(86) PCT No.: PCT/EP2019/055108
§ 371 (c)(1),
(2) Date: Aug. 25, 2020

(87) PCT Pub. No.: WO2019/166612
PCT Pub. Date: Sep. 6, 2019

(65) Prior Publication Data
US 2020/0408838 A1 Dec. 31, 2020

(30) Foreign Application Priority Data
Mar. 2, 2018 (EP) .................................... 18159754

(51) Int. Cl.
*G01R 31/28* (2006.01)
*G01R 31/317* (2006.01)
*G01R 31/319* (2006.01)

(52) U.S. Cl.
CPC ... *G01R 31/31723* (2013.01); *G01R 31/2837* (2013.01); *G01R 31/2841* (2013.01); *G01R 31/31917* (2013.01)

(58) Field of Classification Search
CPC .......... G01R 31/31723; G01R 31/2837; G01R 31/2841; G01R 31/31917
See application file for complete search history.

(56) References Cited

U.S. PATENT DOCUMENTS

| 2006/0161409 | A1 | 7/2006 | Root et al. |
| 2009/0184722 | A1 | 7/2009 | Gunyan et al. |
| 2011/0163762 | A1* | 7/2011 | Marchetti .............. G01R 27/32 324/615 |

FOREIGN PATENT DOCUMENTS

WO 2007081705 7/2007

OTHER PUBLICATIONS

Madonna et al., "Simple technique for measuring source reflection coefficient while characterizing active devices" (Year: 2002).*

(Continued)

*Primary Examiner* — Feba Pothen
(74) *Attorney, Agent, or Firm* — N.V. Nederlandsch Octrooibureau

(57) ABSTRACT

A method for measuring (and controlling) a characteristic performance parameter $\Gamma_s$ of a device under test (DUT) having an input port (at the minimum). The method involves connecting the input port of the DUT to a signal generator, subjecting the DUT to a large signal input test signal, and executing a first measurement of the incident wave and reflected wave at a DUT input reference plane. The method further involves subjecting the DUT to a perturbation signal combined with the large signal input test signal, and executing a second measurement of the incident wave and reflected wave at the DUT input reference plane, and determining the characteristic performance parameter from the first measurement and the second measurement.

8 Claims, 3 Drawing Sheets

(56) References Cited

OTHER PUBLICATIONS

Teppati et al., "Microwave Measurements—Part III Advanced nonlinear measurements" (Year: 2008).*

Verspecht et al: "Characterizing Components Under Large Signal Excitation: Defining Sensible 'Large Signal S-Parameters'?!", ARFTG Conference Digest-Spring, Jun. 1, 1997 (Jun. 1, 1997), pp. 109-117, XP055499460.

Bespalko et al: "X-Parameter Measurement Challenges for Unmatched Device Characterization", Microwave Measurements Conference (ARFTG) 2010 75th ARFTG, IEEE, Piscataway, NJ, May 28, 2010 (May 28, 2010), pp. 1-4.

Gou et al: "Analytical Reflection Coefficient Expressions Utilizing Load-Dependent X-Parameters", IEEE Transactions on Microwave Theory and Techniques, Plenum, USA, vol. 63, No. 10, Oct. 1, 2015 (Oct. 1, 2015), pp. 3142-3152.

Gasseling et al: "A New Characterization Technique of "Four Hot S parameters" for the Study of Nonlinear Parametric Behaviors of Microwave Devices", 2003 IEEE MTT-S International Microwave Symposium Digest.(IMS 2003). Philadelphia. Jun. 8-13, 2003; Jun. 8, 2003 (Jun. 8, 2003), pp. 1663-1666.

Csamii: "High Power Amplifier Measurements Using Agilent's Nonlinear Vector Network Analyzer", Jan. 26, 2010 (Jan. 26, 2010), XP055499605, Retrieved from the Internet: URL:http://na.support.keysight.com/pna/nvna/NVNAWebHelp/NVNAHiPwrMeas.pdf.

Verspecht et al: "Linearization of Large-Signal Scattering Functions", IEEE Transactions on Microwave Theory and Techniques. Plenum. USA. vol. 53, No. 4. Apr. 1, 2005 (Apr. 1, 2005), pp. 1369-1376.

Ferrero et al: "Simple Technique for Source Reflection Coefficient Measurement While Characterizing Active Devices", ARFTG Conference Digest-Spring, 19th ARFTG, IEEE, PI, Jun. 1, 1999 (Jun. 1, 1999), pp. 1-3.

* cited by examiner

SIGNAL INJECTION TECHNIQUE FOR MEASUREMENT AND CONTROL OF SOURCE REFLECTION COEFFICIENT OF A DEVICE UNDER TEST

FIELD OF THE INVENTION

The present invention relates to a method for measuring and controlling a characteristic performance parameter of a device under test (DUT) having an input port, such as a semiconductor active component in the form of a transistor, a FET, etc., operating at RF, microwave or (sub)millimetre-wave frequencies. In this document, characteristic performance parameters of the DUT are understood to be a source reflection coefficient $\Gamma_S$ of the DUT.

BACKGROUND ART

U.S. Pat. No. 8,269,508 describes a method for calculating the performance of a transistor with any source impedance $\Gamma_S$. This method does not physically apply nor measure a different source impedance to the transistor, but it's a mathematical calculation done in a post-processing. Furthermore, the method as disclosed assumes that the transistor is perfectly unilateral ($S_{12}=0$), which is rarely true.

US patent publication US2002/0196033 describes a method to measure the "hot-S22" of a DUT wherein the DUT is stimulated by a one-tone excitation signal at the input port, and the S22 under large-signal is measured by applying a probe tone at an offset frequency at its output.

U.S. Pat. No. 7,038,468 describes a method to measure all the DUT hot S-parameters by using probe tones at an offset frequency.

The article by Jan Verspecht et al. 'Characterizing Components Under Large Signal Excitation: Defining Sensible "Large Signal S-Parameters"; $19^{th}$ ARTFG, 1 Jun. 1997, pages 109-117, discloses a measurement technique enabling characterization of nonlinear microwave components under periodic large-signal excitation. A black-box model of the component is deduced from large-signal measurements.

US patent publication US2006/161409 discloses a behavioral model generation, wherein a device under test is stimulated with a large amplitude signal having a control frequency, and perturbed with a small amplitude signal tone, which is at a frequency offset slightly from a harmonic of the central frequency. The small amplitude signal tone at offset frequency is necessary to be able to extract a model of the device under test.

US patent publication US2009/184722 discloses a method of measurements including large-signal S scattering functions of a device under test having two distinct phases for small signals on a frequency grid established by intermodulation frequencies and harmonics of large tone signals.

International patent publication WO2007/081705 discloses a method of characterizing nonlinear behavior of amplifiers using load pull measurements, using a behavioral modelling technique.

SUMMARY OF THE INVENTION

A device under test (DUD can be represented in terms of travelling waves or in terms of its scattering matrix S. With respect to an active DUT, the scattering matrix S is sufficient enough to describe its linear behaviour under small signal conditions and in a 50Ω environment. However, when moving to a large-signal condition, the device performance changes non-linearly as a function of input power drive and as a function of the terminations provided at its input (source) and its output (load). Therefore, for an active DUT, it is important to measure certain characteristic performance parameters as a function of input power drive and of the source and load reflection coefficients $\Gamma_S$ and $\Gamma_L$ presented at the input and output of the active DUT. However, when stimulating a DUT from its input with a signal at a given frequency only, $\Gamma_{IN}$ and $\Gamma_L$ can be only measured as $$\Gamma_{IN} = \frac{b_1}{a_1} \text{ and } \Gamma_L = \frac{a_2}{b_2}.$$

The present invention seeks to provide a method to measure characteristic performance parameters of a DUT, more in particular a method to control and measure the source reflection coefficient of a DUT in a reliable, consistent and robust manner, without the need for any additional hardware, such as sources or impedance tuners.

According to the present invention, a method is provided for measuring characteristic performance parameters $\Gamma_S$ of an active device under test (DUD having an input port (or multiple input ports). The DUT operational behaviour is described by a scattering matrix S relating an input incident wave $a_1$ and an input reflected wave $b_1$ at the input port of the DUT, and/or an output incident wave $a_2$ and an output reflected wave $b_2$ at the output port of the DUT. The method comprises connecting the input port of the DUT to a signal generator, subjecting the DUT to an input test signal, and executing a first measurement $a_1'$, $b_1'$ of the incident wave $a_1$ and reflected wave $b_1$ at a DUT input reference plane. The method further comprises subjecting the DUT to a perturbation signal combined with the input test signal (or equivalently changing the input power to the DUD, and executing a second measurement $a_1''$, $b_1''$ of the incident wave $a_1$ and reflected wave $b_1$ at the DUT input reference planes, and determining the characteristic performance parameter from the first measurement and the second measurement, wherein the characteristic performance parameter is a source reflection coefficient $\Gamma_S$.

The present invention provides method embodiments that allow to measure and control the source reflection coefficient $\Gamma_S$ presented to a DUT as a function of the input power drive and/or of load reflection coefficient $\Gamma_L$, while the device is stimulated from its input port. Thus, the present invention provides a method to perform source pull in any test system having a signal source and an input coupler section, without the need for any additional hardware. Also, the method does not use excitations at offset frequencies. Further embodiments are described by the dependent claims. An advantageous aspect of the present invention is that the control of the source reflection coefficient is achieved by physically using a single signal source (the same source used for generating the input test signal to the DUD, and without the need for impedance tuners (e.g. passive mechanical or electronic tuners).

SHORT DESCRIPTION OF DRAWINGS

The present invention will be discussed in more detail below, with reference to the attached drawings, in which.

Figure 3A:
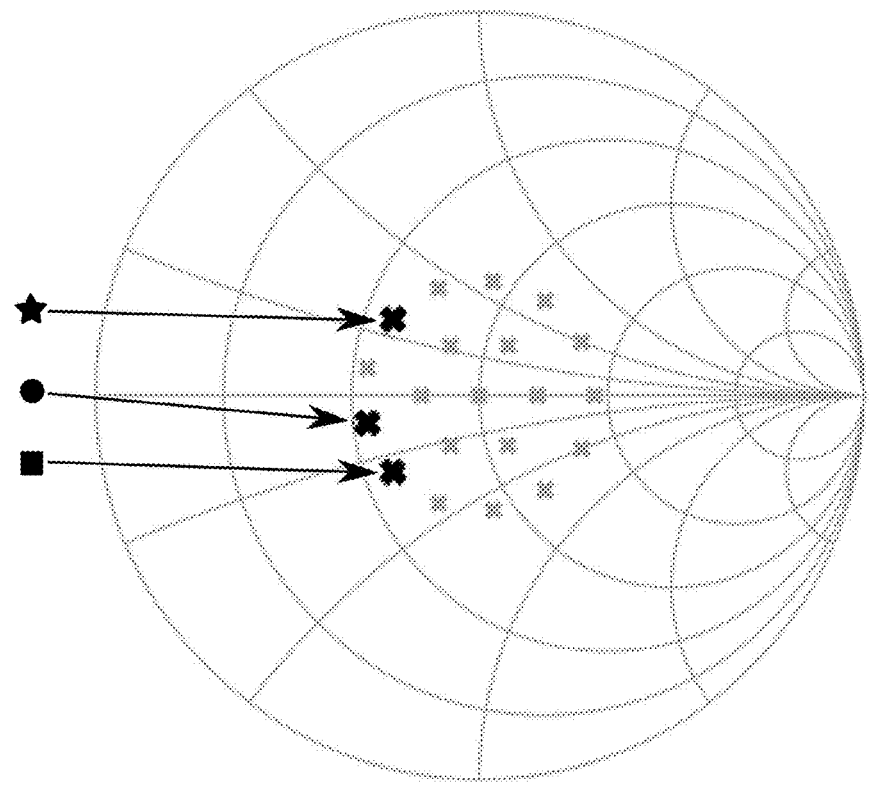
Figure 3B:
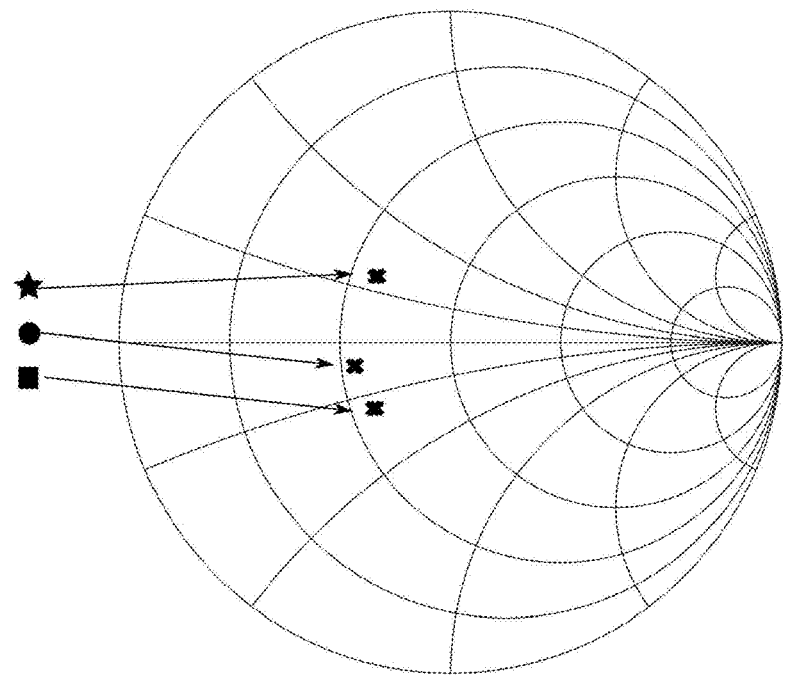
Figure 3C:
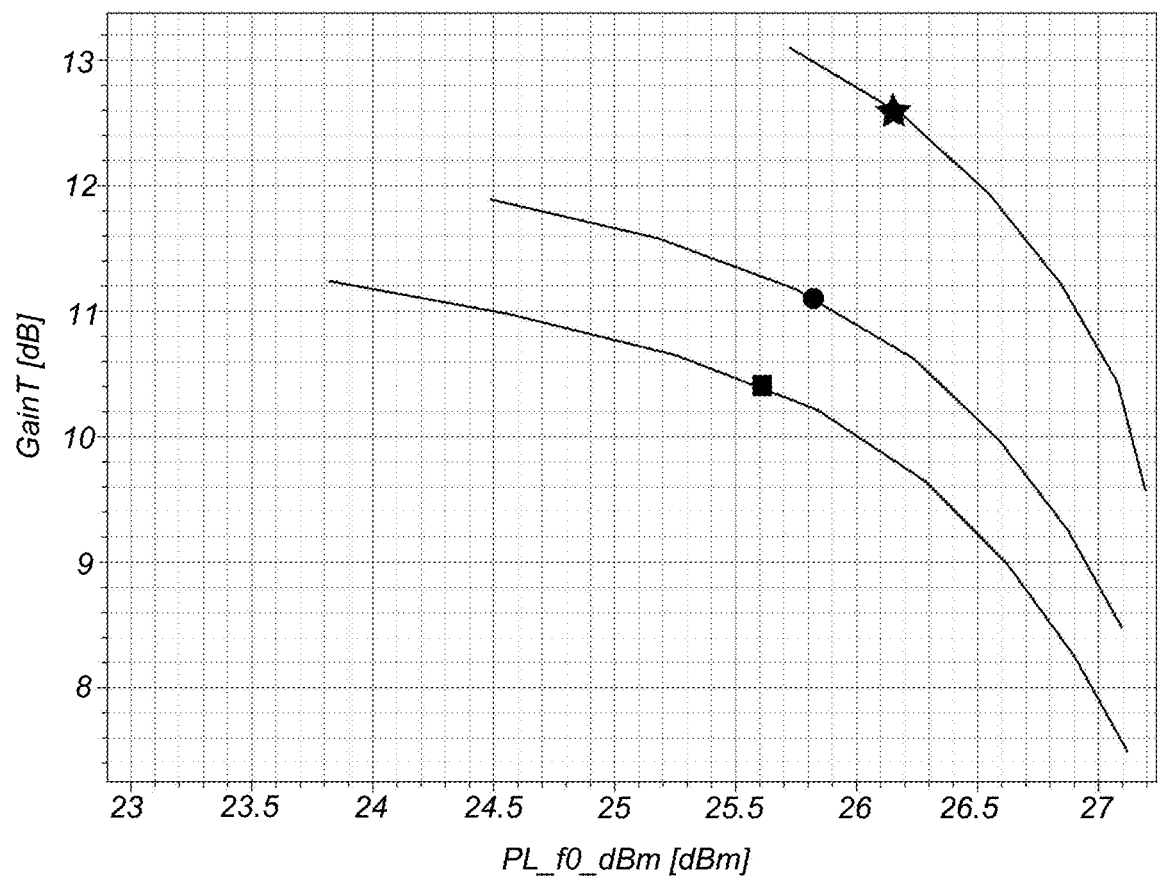

FIG. 3A-C show graphical representations relating to exemplary measurements executed according to an embodiment of the present invention.

DESCRIPTION OF EMBODIMENTS

Figure 1:
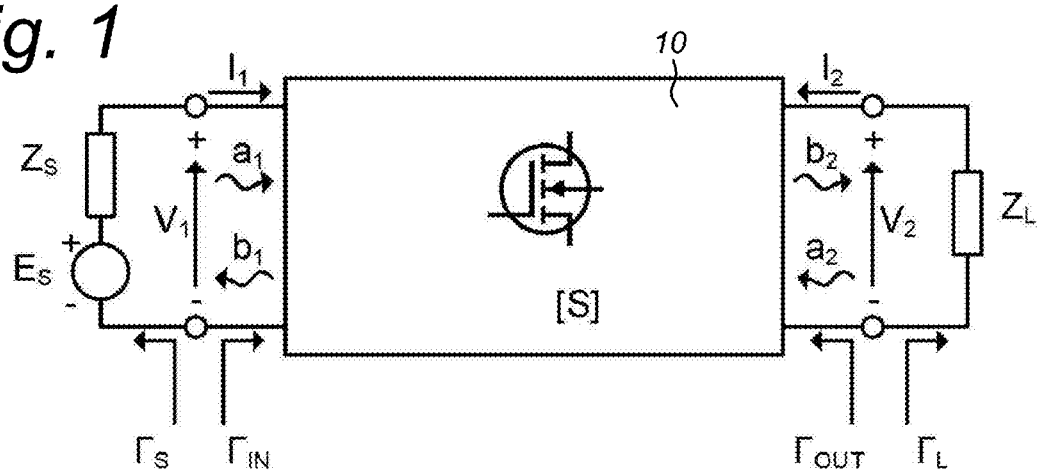
FIG. 1 shows a schematic representation of a DUT having an input and output port in a measurement set-up according to an embodiment of the present invention.
Figure 2:
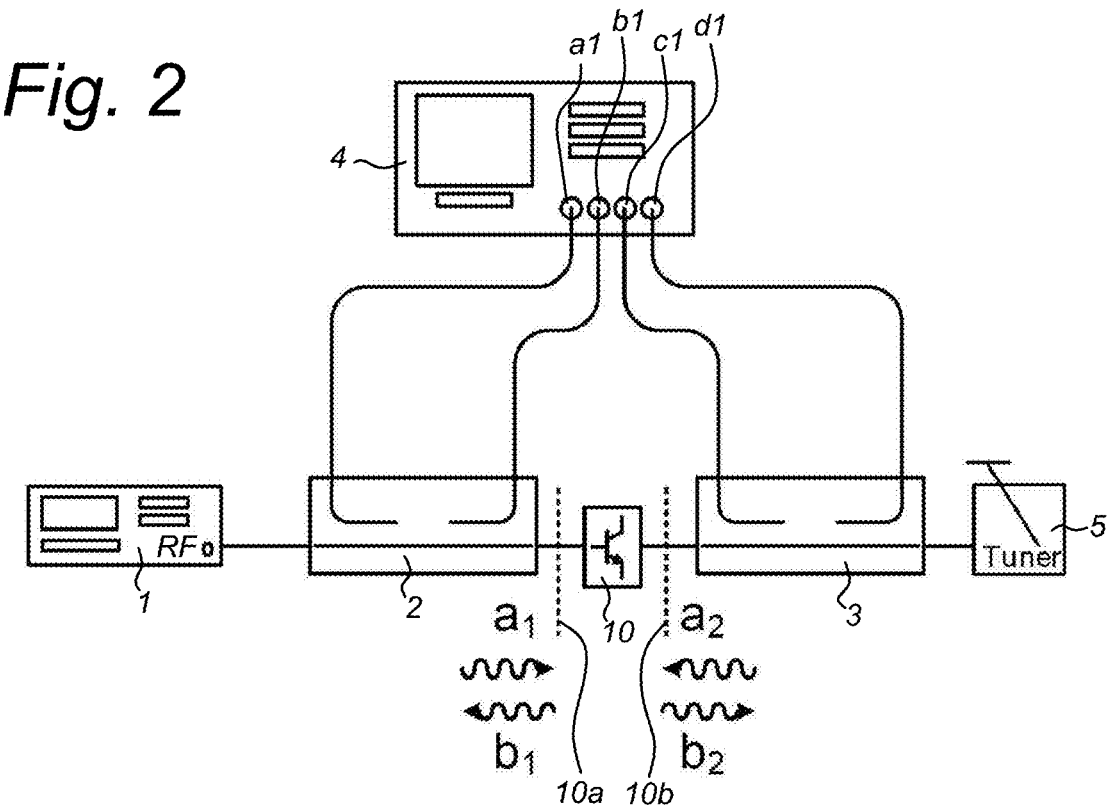
FIG. 2 shows a schematic representation of a measurement system according to a further embodiment of the present invention.

The present invention embodiments relate to a method for measuring a characteristic performance parameter $\Gamma_S$ of an active device under test (DUT) 10 having an input port. The DUT 10 can be a semiconductor component such as a transistor or a Field Effect Transistor (FED. FIG. 1 show schematic representations of such a DUT having an input and output port, and FIG. 2 shows a typical measurement set-up according to an embodiment of the present invention.

The present invention method embodiments can be applied on any measurement system comprised of a signal generator 1 and one or more receivers 4 to measure $a_1$, $b_1$ such as a Vector Network Analyzer (VNA) or a load-pull system. FIG. 2 shows a schematic representation of a measurement system, according to one embodiment of the present invention, which depicts a load-pull measurement system based on a four-channel receiver 4 (e.g. a VNA) and a generic load tuner 5. A signal generator 1 is connected to the DUT 10. The DUT 10 can be stimulated at any given frequency $f_1$ by the signal generator 1. The incident, reflected and scattered waves ($a_1$, $b_1$, $a_2$, $b_2$) are coupled with an input coupler 2 and an output coupler 3 and measured by a VNA 4. The output load impedance $Z_L$ can be tuned by use of any generic tuner 5, which can be either active or passive. Multiple tuners on the source or on the load can be used for controlling the reflection coefficient at one or more frequencies. Further, bias tees can be used for providing biasing voltages to the DUT 10. Various additional instruments, e.g. spectrum analysers, vector signal analysers or power meters can be used to perform additional measurements. In an alternative embodiment of the present invention, the signal generator 1, the input coupler 2, output coupler 3, and the receiver 4 can be integrated into a single measurement instrument like a VNA. The number of channels in the receiver 4 can vary as the measurements of $a_1$, $b_1$, can be made in sequence. In such a case, a reference channel might be needed so that the waves $a_1$, $b_1$, $a_2$ and $b_2$ can be acquired in amplitude and/or phase.

The DUT 10 operational behaviour is described by a scattering matrix S relating an input incident wave $a_1$ and an input reflected wave $b_1$ at the input port of the DUT 10, and an output incident wave $a_2$ and an output reflected wave $b_2$ at the output port of the DUT 10. The method comprises connecting the input port of the DUT 10 to a signal generator 1 (see FIG. 2), and the output port to an output load impedance $Z_L$ (in FIG. 2 embodiment shown as a tuner 5). The method embodiments further comprise subjecting the DUT 10 to an input test signal, and executing a first measurement $a_1'$, $b_1'$ of the incident wave $a_1$ and reflected wave $b_1$ at a respective DUT input reference plane 10a. The input test signal is generated by a signal generator 1 and can have a fixed input power signal (e.g. an input test signal referred to in the art as a large signal input test signal). The method further comprises subjecting the DUT 10 to a perturbation signal combined with the input test signal, and executing a second measurement $a_1''$, $b_1''$ of the incident wave $a_1$ and reflected wave $b_1$ at the respective DUT input reference plane 10a. The method further comprises determining the characteristic performance parameter $\Gamma_S$ from the first measurement $a_1'$, $b_1'$ and the second measurement $a_1''$, $b_1''$, wherein the characteristic performance parameter is a source reflection coefficient $\Gamma_S$. Thus, the present invention embodiments allow to for e.g. to control the source impedance (or source pull) on a DUT at any given frequency. As shown in FIG. 1, the signal generator 1 is equivalent to a voltage source Es having a source impedance $Z_S$. The current at the input side is represented by $I_1$ and at the output side is represented by $I_2$. The voltage across the input terminals is represented by $V_1$ and between output terminals is represented by $V_2$. $\Gamma_S$ is the source impedance provided at the DUT input reference plane 10a. The performance parameters of the DUT such as input and output power, efficiency, etc. can be measured from the measurement of a1", b1"; a2", b2", as a function of the newly applied $\Gamma_S$.

In some embodiments of the present invention, the large signal input test signal is one of the group comprising: a continuous wave (CW) signal, a pulsed CW signal at a test frequency f1, a multi-tone signal, a modulated signal. The multi-tone signal can be comprised of multiple frequency components. Alternatively, the method described here can be applied at any or all the frequency components of the input signal. In a further embodiment of the present invention, the perturbation signal has a frequency corresponding to one or more frequency components of the large signal input test signal.

To control the source reflection coefficient to the DUT 10, the input test signal is perturbed during a test by adding a signal which can be controlled in amplitude and/or phase. In another embodiment of the present invention the perturbation signal comprises a perturbation of the amplitude of the (large signal) input test signal. In a further embodiment of the present invention, the perturbation signal comprises a perturbation of the phase of the (large signal) input test signal. By changing the amplitude and/or phase of the perturbation, the source reflection coefficient $\Gamma_S$ can be controlled, while $\Gamma_S$ can be measured at each perturbation by measuring the incident wave $a_1$ and the reflected wave $b_1$ with two subsequent measurements. The two subsequent measurements comprises the first measurement with the original test signal without applying any perturbation and the second measurement with applying the perturbation. Yet another embodiment of the present invention relates to subjecting the DUT 10 to a perturbation signal combined with the (large signal) input test signal that is obtained by controlling the signal generator 1.

In one embodiment of the present invention, the characteristic performance parameter is a source reflection coefficient $\Gamma_S$, and the DUT reference plane is at the input port of the DUT 10. The input and reflected waves $a_1$ and $b_1$ are linked to the wave $b_S$ generated by the signal generator 1 and the source reflection coefficient $\Gamma_S$ can be related by the equation:

$$a_1 = bs + \Gamma_S \cdot b_1$$

According to this embodiment, the following steps can be used to measure and control $\Gamma_S$:

A first reference measurement of $a_1$ and $b_1$ is performed at a fixed input power, providing the following equation:

$$a'_1 = bs_0 + \Gamma_{S0} \cdot b'_1$$

where $\Gamma_{S0}$ is the (passive) source reflection coefficient given by the source at the DUT input reference plane. $\Gamma_{S0}$ is known a-priori either with a separate VNA measurement, or through a calibration measurement. The waves $a_1'$ and $b_1'$ are measured by the receiver 4. The parameter $bs_0$ is a source wave, which is not required to be known as demonstrated below.

In a second step, the source signal generated by signal generator 1 can be varied in a controlled, but arbitrary way, in amplitude and/or phase by adding an arbitrary wave $b_s'$ to the original source signal $b_{s0}$ so that $bs_1 = bs_0 + bs'$. This can be achieved by simply varying the power generated by the signal generator 1. Further, a new measurement of $a_1$ and $b_1$ is taken with the receiver 4 providing the following equations:

$$a''_1 = bs_1 + \Gamma_{S0} \cdot b''_1$$

$$a''_1 = bs_0 + bs' + \Gamma_{S0} \cdot b''_1$$

The wave bs' is effectively changing only the source impedance, instead of changing the source power. As a result, the following equation applies:

$$\Gamma_{S1} \cdot b''_1 = bs' + \Gamma_{S0} \cdot b''_1$$

where $\Gamma_{S1}$ is the effective new source impedance provided to the DUT.

Thus, the method of determining the characteristic performance parameter from the first measurement and the second measurement comprises measuring and controlling an effective source reflection coefficient $\Gamma_{S1}$ in accordance with the formula:

$$\Gamma_{S1} = \frac{a''_1 - a'_1 + \Gamma_{S0} \cdot b_{1'}}{b''_1}$$

wherein $\Gamma_{S0}$ is a predetermined passive source reflection coefficient given by the source at the DUT input reference plane. To further control $\Gamma_S$, the wave bs' can be modified and a new equivalent $\Gamma_{S1}$ can be calculated.

In another embodiment of the present invention, the first measurement is executed at a fixed input power of the (large signal) input test signal. In a further embodiment of the present invention, the second measurement is executed with a perturbation of the fixed input power of the (large signal) input test signal. This can be obtained by simply varying the power of the signal generator 1.

It is noted that the input test signal may be a large signal input test signal, but the method may also be seen as subjecting the DUT 10 to an input signal or an input wave $b_{s0}$.

The perturbation can be implemented as modifying the power of the input test signal or modifying the power of the input wave $b_{s0}$. The modification of power of the input test signal is equivalent to mathematically adding a new wave $b_s'$ to the original wave $b_{s0}$. By controlling the amplitude and phase of $b_s'$ it is possible to change the input power. In the method embodiments as disclosed above it is mathematically imposed that the change in input power does not result in a physical change of input power, but rather in a physical change of $\Gamma_S$.

FIG. 3A-C show graphical representations related to measurements executed according to an embodiment of the present invention. In this embodiment, the method has been applied to measure and control the source reflection coefficient $\Gamma_S$ of a DUT 10, in this particular case an RF transistor. The setup used for the measurement and control of the source reflection coefficient is similar to the one depicted in FIG. 2, where a VNA 4 is used for measuring the $a_1$, $b_1$, $a_2$ and $b_2$ waves, and an arbitrary waveform generator 1 is used as signal source. By varying the power generated by the signal generator 1) and applying the method, a source pull sweep is performed and the transistor (DUT 10) performance is evaluated for several different source reflection coefficients $\Gamma_S$, FIG. 3A shows the user-defined source reflection coefficient that is applied to the DUT for three specific points on the Smith chart. FIG. 3B shows the source reflection coefficient $\Gamma_S$ measured with the present invention method at the input of the DUT 10. FIG. 3C shows a measurement of gain vs. output power for all the three different source reflection coefficients $\Gamma_S$ presented to the RF transistor as DUT 10. From this plot it can be seen how by changing the source reflection coefficient $\Gamma_S$ the Gain of the active device (DUT 10) is affected. The method can therefore be used to find the optimum source impedance matching to maximize some specific performance parameters of the active devices (DUT 10) such as transducer gain or third order intermodulation distortion.

The present invention has been described above with reference to a number of exemplary embodiments as shown in the drawings. Modifications and alternative implementations of some parts or elements are possible, and are included in the scope of protection as defined in the appended claims.

The invention claimed is:

1. A method for measuring and controlling a characteristic performance parameter of a device under test, DUT, having an input port, wherein DUT operational behaviour is described by a scattering matrix S relating an input incident wave $a_1$ and an input reflected wave $b_1$ at the input port of the DUT, the method comprising:
  connecting the input port of the DUT to a signal generator,
  subjecting the DUT to an input test signal, and executing a first measurement of the incident wave and the reflected wave at a DUT input reference plane,
  subjecting the DUT to a perturbation signal combined with the input test signal, and
  executing a second measurement of the incident wave and the reflected wave at the DUT input reference plane, and
  determining the characteristic performance parameter from the first measurement and the second measurement, wherein the characteristic performance parameter is a source reflection coefficient $\Gamma_S$,
  wherein the DUT input reference plane is at the input port of the DUT, and wherein determining the characteristic performance parameter from the first measurement and the second measurement comprises
  measuring and controlling an effective source reflection coefficient $\Gamma_{S1}$ in accordance with the formula:

$$\Gamma_{S1} = \frac{a''_1 - a'_1 + \Gamma_{S0} \cdot b_{1'}}{b''_1}$$

wherein $\Gamma_{S0}$ is a predetermined passive source reflection coefficient given by the source at the DUT input reference plane,
  $a_1'$ and $b_1'$ being the first measurement of the incident wave and the reflected wave, respectively, and
  $a_1''$ and $b_1''$ being the second measurement of the incident wave and the reflected wave, respectively.

2. The method according to claim 1, wherein the input test signal is one of the group comprising: a CW signal, a pulsed CW signal at a test frequency $f_1$, a multi-tone signal, a modulated signal.

3. The method according to claim 1, wherein the perturbation signal has a frequency corresponding to one or more frequency components of the input test signal.

4. The method according to claim 1, wherein the perturbation signal comprises a perturbation of the amplitude of the input test signal.

5. The method according to claim 1, wherein the perturbation signal comprises a perturbation of the phase of the input test signal.

6. The method according to claim 1, wherein subjecting the DUT to a perturbation signal combined with the input test signal is obtained by controlling the signal generator.

7. The method according to claim 1, wherein the first measurement is executed at a fixed input power of the input test signal.

8. The method according to claim 1, wherein the second measurement is executed with a perturbation of the fixed input power of the input test signal.

* * * * *